United States Patent
Wu et al.

(10) Patent No.: US 9,590,055 B2
(45) Date of Patent: Mar. 7, 2017

(54) THIN FILM TRANSISTOR, METHOD FOR MANUFACTURING THE SAME, ARRAY SUBSTRATE, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Chunwei Wu, Beijing (CN); Woobong Lee, Beijing (CN)

(73) Assignees: BOE TECHNOLOGY GROUP CO., LTD. (CN); HEFEI XINSHENG OPTOELECTRONICS TECHNOLOGY CO., LTD. (CN)

(*) Notice: Subject to any disclaimer, the term of this patent is extended or adjusted under 35 U.S.C. 154(b) by 83 days.

(21) Appl. No.: 14/436,373

(22) PCT Filed: Aug. 29, 2014

(86) PCT No.: PCT/CN2014/085499
§ 371 (c)(1),
(2) Date: Apr. 16, 2015

(87) PCT Pub. No.: WO2015/143837
PCT Pub. Date: Oct. 1, 2015

(65) Prior Publication Data
US 2016/0293716 A1    Oct. 6, 2016

(30) Foreign Application Priority Data
Mar. 25, 2014  (CN) .......................... 2014 1 0113582

(51) Int. Cl.
*H01L 29/423* (2006.01)
*H01L 29/417* (2006.01)
(Continued)

(52) U.S. Cl.
CPC .... *H01L 29/41733* (2013.01); *H01L 27/1225* (2013.01); *H01L 29/66969* (2013.01); *H01L 29/7869* (2013.01)

(58) Field of Classification Search
CPC .................... H01L 29/41733; H01L 29/42384
See application file for complete search history.

(56) References Cited

U.S. PATENT DOCUMENTS

| | | |
|---|---|---|
| 6,479,398 B1 | 11/2002 | Chen et al. |
| 2006/0170048 A1 | 8/2006 | Chiu et al. |
| 2013/0153889 A1* | 6/2013 | Yamazaki ......... H01L 21/02565 257/43 |

FOREIGN PATENT DOCUMENTS

| | | |
|---|---|---|
| CN | 1448902 A | 10/2003 |
| CN | 1536681 A | 10/2004 |

(Continued)

OTHER PUBLICATIONS

Office Action in Chinese Patent Application No. 201410113582.4, dated Mar. 3, 2016.
(Continued)

*Primary Examiner* — Thomas L Dickey
(74) *Attorney, Agent, or Firm* — Bakerhostetler LLP

(57) ABSTRACT

The present disclosure provides a thin film transistor and its manufacturing method, an array substrate, a display device. The thin film transistor includes a gate electrode, a gate insulating layer, an active layer, a source electrode and a drain electrode. The source electrode and the drain electrode are formed above the active layer and located at a first end and a second end of the active layer which are opposite to each other, respectively. The drain electrode completely covers the second end of the active layer.

15 Claims, 3 Drawing Sheets

(51) Int. Cl.
  *H01L 29/786*  (2006.01)
  *H01L 27/12*  (2006.01)
  *H01L 29/66*  (2006.01)

(56) References Cited

FOREIGN PATENT DOCUMENTS

| CN | 101055879 A | 10/2007 |
|----|-------------|---------|
| CN | 101556959 A | 10/2009 |
| CN | 101750826 A | 6/2010 |
| CN | 102054832 A | 5/2011 |
| CN | 102593189 A | 7/2012 |
| CN | 103545221 A | 1/2014 |
| CN | 103915509 A | 7/2014 |
| CN | 203746864 U | 7/2014 |

OTHER PUBLICATIONS

International Search Report and Written Opinion in PCT International Application No. PCT/CN2014/085499, dated Dec. 31, 2014.
Office Action in Chinese Patent Application No. 201410113582.4, dated Aug. 25, 2016.

\* cited by examiner

THIN FILM TRANSISTOR, METHOD FOR MANUFACTURING THE SAME, ARRAY SUBSTRATE, AND DISPLAY DEVICE

CROSS-REFERENCE TO RELATED APPLICATIONS

This present application is the U.S. national phase of PCT Application No. PCT/CN2014/085499 filed on Aug. 29, 2014, which claims a priority of the Chinese patent application No. 201410113582.4 filed on Mar. 25, 2014, which is incorporated herein by reference in its entirety.

TECHNICAL FIELD

The present disclosure relates to the field of display technology, in particular to a thin film transistor, a method for manufacturing the same, an array substrate, and a display device.

BACKGROUND

For an oxide thin film transistor (TFT) of the back-channel-etching (BCE) type in the related art, a source electrode and a drain electrode are arranged directly on an active layer, i.e., there is no etch stopping layer (ESL) being arranged between the source/drain electrode and the active layer. Due to lack of a protection by the ESL, a portion of the active layer which is not covered by the source/drain electrode may be adversely affected by subsequent manufacture process, environment where the active layer is located after being manufactured, or the like, thereby to influence performance of an oxide thin film transistor.

SUMMARY

An object of the present disclosure is to provide a thin film transistor, an array substrate and a display device, so as to effectively protect an active layer in an oxide thin film transistor of the BCE type.

The present disclosure provides embodiments a thin film transistor, including a gate electrode, a gate insulating layer, an active layer, a source electrode and a drain electrode,
wherein the source electrode and the drain electrode are formed above the active layer, and located at a first end and a second end of the active layer which are opposite to each other, respectively; and
the drain electrode completely covers the second end of the active layer.

Alternatively, the drain electrode is of a rectangular shape.

Alternatively, the drain electrode includes a covering electrode and a contacting electrode connected to each other,
the covering electrode completely covers the second end of the active layer, and is of a width in a longitudinal direction greater than or equal to that of the active layer;
the contacting electrode is configured to contact a pixel electrode; and is of a width in the longitudinal direction greater than that of the covering electrode, and
wherein the longitudinal direction is vertical to a connecting line between the first end and the second end of the active layer.

Alternatively, the drain electrode includes:
a covering electrode, a contacting electrode and a connecting electrode, the connecting electrode is located between the covering electrode and the contacting electrode and connected to the covering electrode and the contacting electrode respectively, wherein
the covering electrode completely covers the second end of the active layer;
the connecting electrode at least partially overlaps the gate electrode and is of a width in a longitudinal direction smaller than that of the covering electrode, the longitudinal direction is vertical to a connecting line between the first end and the second end of the active layer; and
the contacting electrode is configured to contact a pixel electrode.

Alternatively, the covering electrode and the connecting electrode are connected in a T form or an L form.

Alternatively, the covering electrode is of a rectangular shape.

Alternatively, the covering electrode is of a shape of a Chinese character "凹" with an opening towards the source electrode.

Alternatively, the contacting electrode is of a width in the longitudinal direction greater than or equal to that of the connecting electrode.

Alternatively, the source electrode completely covers the first end of the active layer.

Alternatively, the source electrode includes a first electrode, a second electrode and a third electrode; the second electrode is located between the first electrode and the third electrode, and connected to the first electrode and the third electrode respectively;
the first electrode completely covers the first end of the active layer; and
the second electrode at least partially overlaps the gate electrode and is of a width in a longitudinal direction smaller than that of the first electrode and the second electrode respectively, the longitudinal direction is vertical to a connecting line between the first end and the second end of the active layer.

Alternatively, the first electrode and the second electrode are connected in a T form or an L form.

Alternatively, the first electrode is of a rectangular shape.

Alternatively, the first electrode is of a shape of a Chinese character "凹" with an opening towards the drain electrode.

The present disclosure further provides in embodiments an array substrate, including the above thin film transistor.

The present disclosure further provides in embodiments a display device, including the above array substrate.

The present disclosure further provides in embodiments a method for manufacturing a thin film transistor, including a step of forming a gate electrode, a gate insulating layer, an active layer, a source electrode and a drain electrode,
wherein the source electrode and the drain electrode are formed above the active layer, and located at a first end and a second end of the active layer which are opposite to each other, respectively,
the drain electrode completely covers the second end of the active layer.

The present disclosure has the following advantageous effects. According to embodiments of the present disclosure, the drain electrode completely covers one end of the active layer, so as to protect the active layer as much as possible, thereby to avoid the active layer from being adversely affected by subsequent manufacturing process, environment where the active layer is located after being manufactured, or the like.

DETAILED DESCRIPTION

In order to make the objects, the technical solutions and the advantages of the present disclosure more apparent, the present disclosure will be described hereinafter in conjunction with the drawings and the embodiments.

The present disclosure provides in embodiments a thin film transistor of the BCE type, which does not include an etch stopping layer. Such thin film transistor includes: a gate electrode, a gate insulating layer, an active layer, a source electrode and a drain electrode. The source electrode and the drain electrode are formed above the active layer, and located at a first end and a second end of the active layer which are opposite to each other, respectively; and the drain electrode completely covers the second end of the active layer.

As the drain electrode my completely cover the second end of the active layer, then a portion of the drain electrode for covering the second end of the active layer is of a width in a longitudinal direction greater than or equal to that of the second end of the active layer. The longitudinal direction is vertical to a connecting line between the first end and the second end of the active layer.

According to embodiments of the present disclosure, the drain electrode of the thin film transistor may completely cover one end of the active layer, so as to protect the active layer as much as possible, thereby to avoid the active layer from being adversely affected by subsequent manufacturing process, environment where the active layer is located after being manufactured, or the like.

The structure of the thin film transistor according to embodiments of the present disclosure will be illustrated in details in conjunction with following specific embodiments.

Embodiment 1

Figure 1:
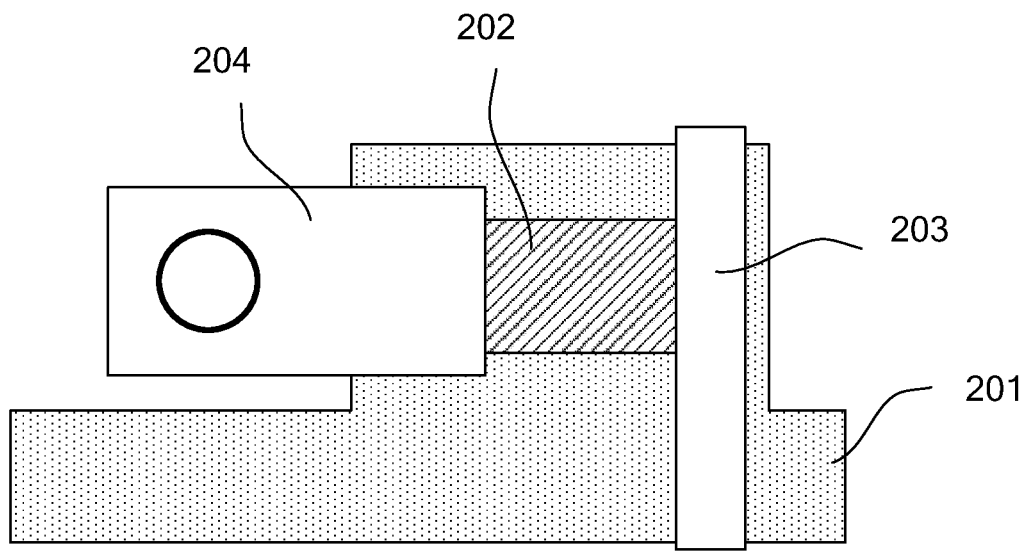
FIG. 1 is a schematic view of the thin film transistor according to Embodiment 1 of the present disclosure.

Referring to FIG. 1, FIG. 1 is a schematic view of the thin film transistor according to Embodiment 1 of the present disclosure. The thin film transistor includes the gate electrode 201, a gate insulating layer (not shown), the active layer 202, the source electrode 203 and the drain electrode 204. The source electrode 203 and the drain electrode 204 are formed above the active layer 202, and located at the first end and the second end of the active layer 202 which are opposite to each other, respectively. The drain electrode 204 completely covers the second end of the active layer 202, and the drain electrode 204 is of a rectangular shape.

Embodiment 2

Figure 2:
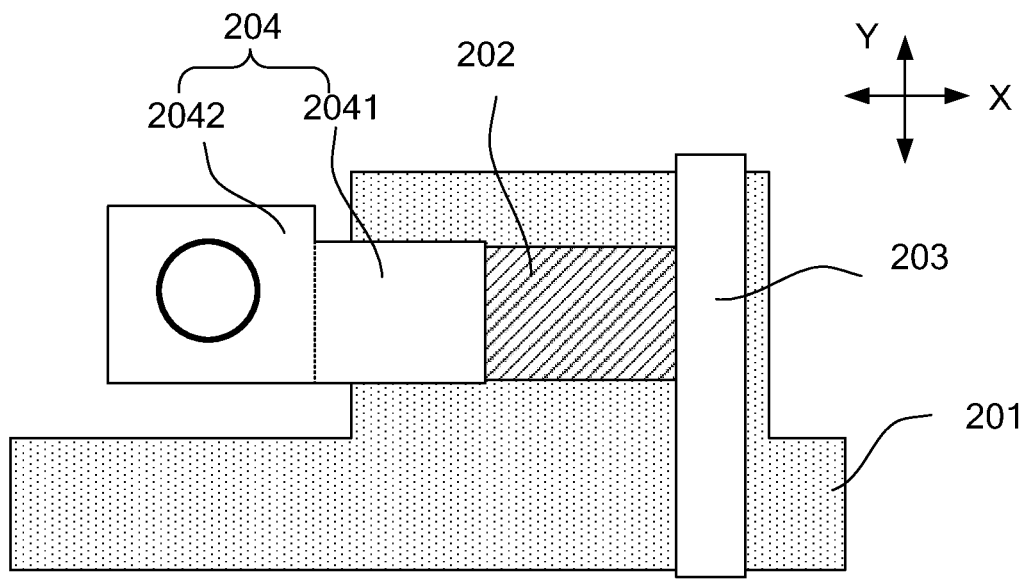
FIG. 2 is a schematic view of the thin film transistor according to Embodiment 2 of the present disclosure.

Referring to FIG. 2, FIG. 2 is a schematic view of the thin film transistor according to Embodiment 2 of the present disclosure. The thin film transistor includes the gate electrode 201, a gate insulating layer (not shown), the active layer 202, the source electrode 203 and the drain electrode 204. The source electrode 203 and the drain electrode 204 are formed above the active layer 202, and located at the first end and the second end of the active layer 202 which are opposite to each other, respectively. The drain electrode 204 completely covers the second end of the active layer 202.

The drain electrode 204 includes a covering electrode 2041 and a contacting electrode 2042, which are connected to each other. The covering electrode 2041 completely covers the second end of the active layer 202. The contacting electrode 2042, configured to contact a pixel electrode, is of a width in a longitudinal direction greater than that of the covering electrode 2041. As shown in FIG. 2, the longitudinal direction (Y-direction) is vertical to a connecting line (X-direction) between the first end and the second end of the active layer.

As compared with Embodiment 1, an overlapping area between the drain electrode 204 and the gate electrode 201 becomes smaller, so that there may be decreased gate/drain capacitance between the drain electrode 204 and the gate electrode 201, thereby to improve performance of the thin film transistor.

Embodiment 3

Figure 3:
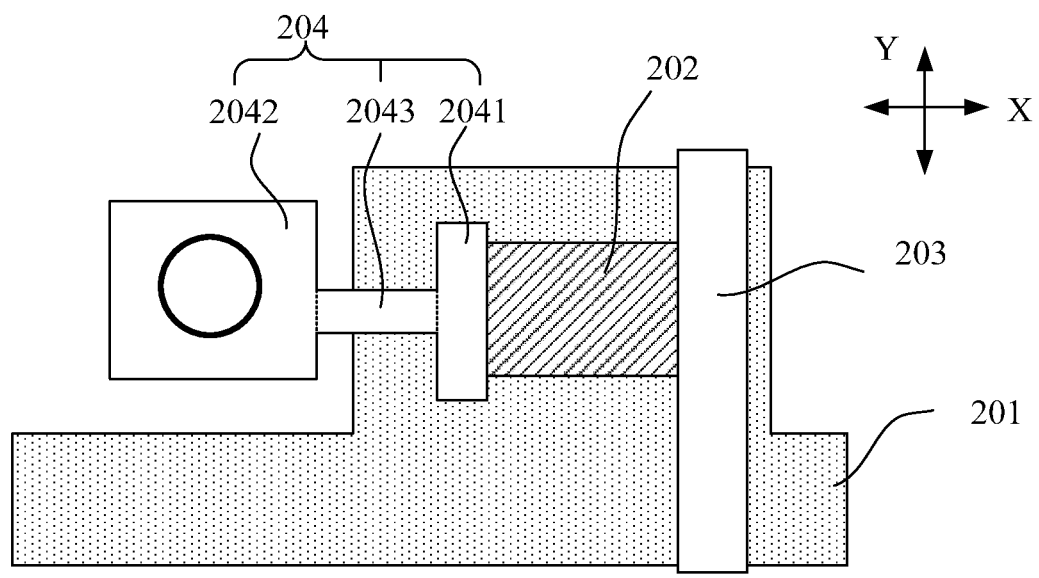
FIG. 3 is a schematic view of the thin film transistor according to Embodiment 3 of the present disclosure.

Referring to FIG. 3, FIG. 3 is a schematic view of the thin film transistor according to Embodiment 3 of the present disclosure. The thin film transistor includes the gate electrode 201, a gate insulating layer (not shown), the active layer 202, the source electrode 203 and the drain electrode 204. The source electrode 203 and the drain electrode 204 are formed above the active layer 202, and located at the first end and the second end of the active layer 202 which are opposite to each other. The drain electrode 204 completely covers the second end of the active layer 202.

The drain electrode 204 includes a covering electrode 2041, a connecting electrode 2043 and a contacting electrode 2042. The connecting electrode 2043 is located between the covering electrode 2041 and the contacting electrode 2042 and connected to the covering electrode 2041 and the contacting electrode 2042, respectively. The covering electrode 2041 completely covers the second end of the active layer 202. The connecting electrode 2043 at least partially overlaps the gate electrode 201. The connecting electrode 2043 is of a width in a longitudinal direction smaller than that of the covering electrode 2041. As shown in FIG. 3, the longitudinal direction (Y-direction) is vertical to a connecting line (X-direction) between the first end and the second end of the active layer. The contacting electrode 2042 is configured to contact a pixel electrode.

As compared with Embodiment 2, the covering electrode 2041 and the connecting electrode 2043 of the drain electrode 204 are connected in a T form, the overlapping area between the drain electrode 204 and the gate electrode 201 becomes even more smaller, so that the gate/drain capacitance (Cgd) between the drain electrode 204 and the gate electrode 201 is further decreased, thereby to improve performance of the thin film transistor.

Embodiment 4

Figure 4:
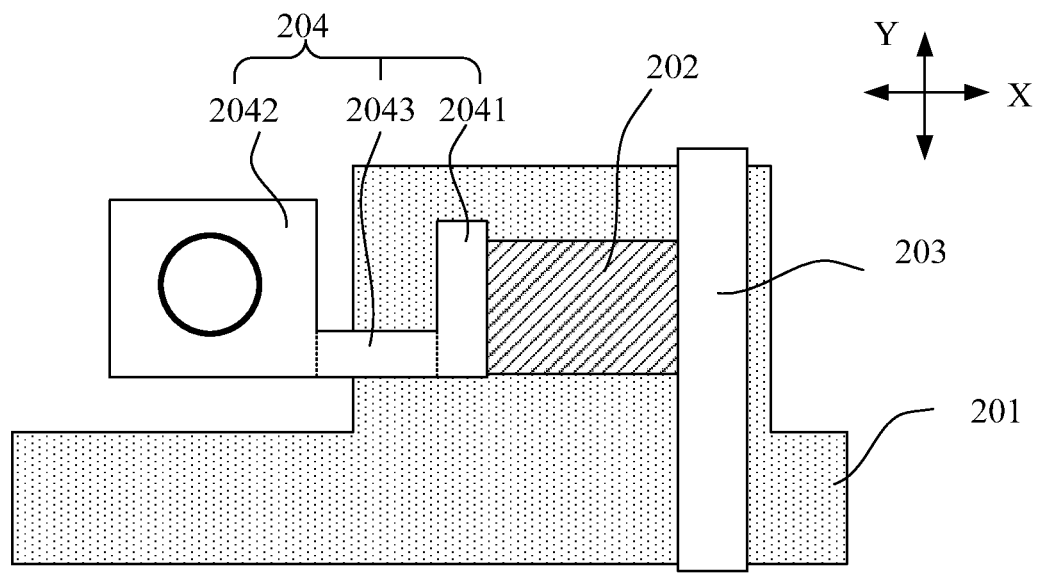
FIG. 4 is a schematic view of the thin film transistor according to Embodiment 4 of the present disclosure.

Referring to FIG. 4, FIG. 4 is a schematic view of the thin film transistor according to Embodiment 4 of the present disclosure. Difference between the present embodiment and the Embodiment 3 lies in that: in the Embodiment 3, the covering electrode 2041 and the connecting electrode 2043 are connected in the T form; while in the present embodiment, the covering electrode 2041 and the connecting electrode 2043 are connected in an L form.

In some other embodiments of the present disclosure, the covering electrode 2041 and the connecting electrode 2043 may be connected in other manners.

The covering electrode in any one of Embodiments 1 to 4 is of a rectangular shape. In some other embodiments of the present disclosure, the covering electrode may also be of other shapes, being described below as an example.

Embodiment 5

Figure 5:
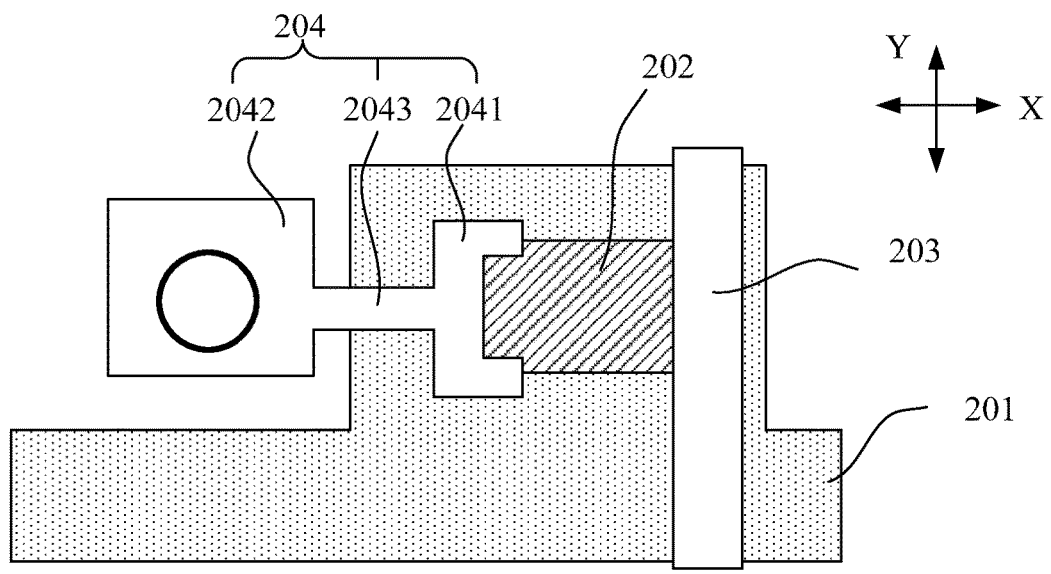
FIG. 5 is a schematic view of the thin film transistor according to Embodiment 5 of the present disclosure.

Referring to FIG. 5, FIG. 5 is a schematic view of the thin film transistor according to Embodiment 5 of the present disclosure. Difference between the present embodiment and the Embodiment 3 lies in that: the covering electrode 2014 is of a shape of a Chinese character "凹", which has an opening towards to the source electrode 203.

In the thin film transistor of such structure, the drain electrode 204 covers a second end of the active layer 202, and further covers a part of two ends of the active layer 202 in the longitudinal direction, thereby to further protect the active layer 202.

In the above embodiments, the source electrode 203 completely covers the first end of the active layer 202 as the drain electrode completely covers the second end of the active layer 202, thereby to further protect the active layer 202.

In any one of the above Embodiments 1 to 5, the source electrode 203 is of a rectangular shape, there is a larger overlapping area between the source electrode 203 and the gate electrode 201 located under the source electrode 203, so that the source electrode 203 and the gate electrode 201 may have larger capacitance therebetween, thereby adversely influences performance of the thin film transistor.

Embodiment 6

Figure 6:
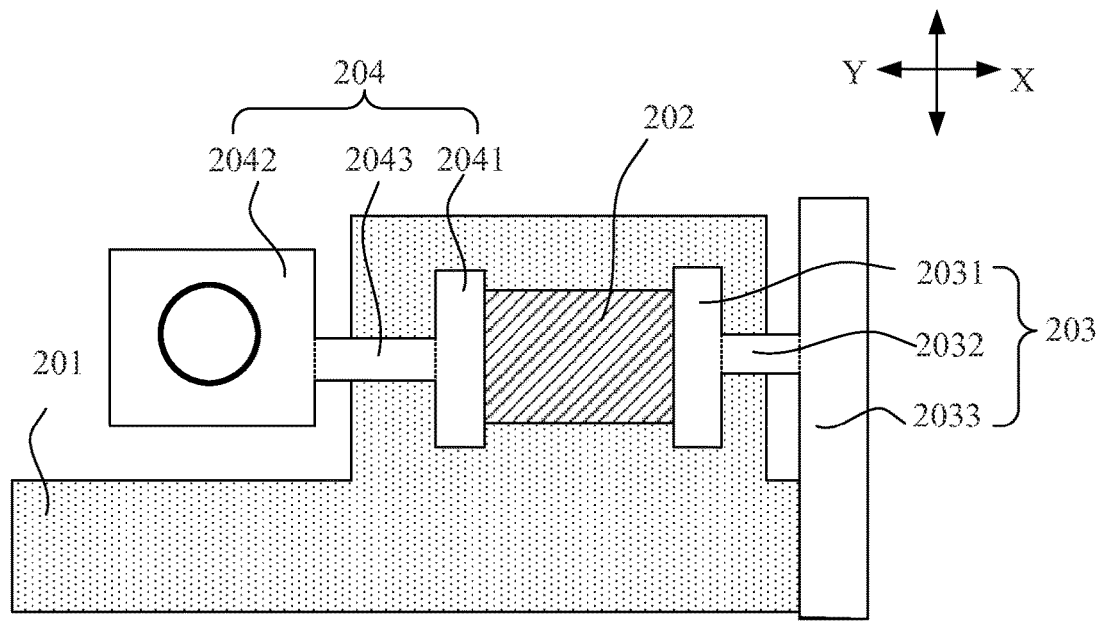
FIG. 6 is a schematic view of the thin film transistor according to Embodiment 6 of the present disclosure.

Referring to FIG. 6, FIG. 6 is a schematic view of the thin film transistor according to Embodiment 6 of the present disclosure. Difference between the present embodiment and the Embodiment 3 lies in that: the source electrode 203 includes a first electrode 2031, a second electrode 2032 and a third electrode 2033; the second electrode 2032 is located between the first electrode 2031 and the third electrode 2033, and connected to the first electrode 2031 and the third electrode 2033, respectively; the first electrode 2031 completely covers the first end of the active layer 202; the third electrode 2033 at least partially overlaps the gate electrode 201 and is of a width in a longitudinal direction smaller than that of the first electrode 2031 and the second electrode 2032, respectively, wherein the longitudinal direction is vertical to a connecting line between the first end and the second end of the active layer 202.

As compared with the above embodiments, in the present embodiment, the overlapping area between the source electrode 203 and the gate electrode 201 is decreased, thus the capacitance between the source electrode 203 and the gate electrode 201 is decreased, thereby to improve performance of the thin film transistor.

In the present embodiment, the first electrode 2031 and the second electrode 2032 are connected in T form. In other embodiments of the present disclosure, the first electrode 2031 and the second electrode 2032 may be also connected in other manners, such as in L form.

In the present embodiment, the first electrode 2031 is of a rectangular shape. In other embodiment of the present disclosure, the first electrode 2031 may also be of other shapes, for example, a shape of a Chinese character "凹" with an opening towards the drain electrode. In the case that a thin film transistor includes the first electrode being of the shape of the Chinese character "凹", then the source electrode covers the first end of the active layer, and further covers a part of two ends of the active layer in the longitudinal direction, thereby to further protect the active layer.

In any one of Embodiments 3 to 6, the contacting electrode 2042 is of a width in the longitudinal direction greater than that of the connecting electrode 2043. In other embodiments of the present disclosure, the contacting electrode 2042 may also be of a width in the longitudinal direction equal to that of the connecting electrode 2043. Besides, it is not excluded that the contacting electrode 2042 is of a width in the longitudinal direction smaller than that of the connecting electrode 2043.

In FIGS. 3 to 6, the dotted lines represent divider lines for dividing the respective parts of the drain electrode 204 in Embodiments 3 to 6.

The present disclosure further provides in embodiments an array substrate, including the thin film transistor according to any one of Embodiments 1 to 6.

The present disclosure further provides in embodiments a display device, including the above array substrate. The display device may be any products or members having a display function, e.g., a liquid-crystal display panel, an electronic paper, an OLED panel, a mobile phone or a flat-panel PC, a TV, a display, a laptop, a digital photo frame, a navigator.

The present disclosure further provides in embodiments a method for manufacturing a thin film transistor. The method includes a step of forming a gate electrode, a gate insulating layer, an active layer, a source electrode and a drain electrode, wherein the source electrode and the drain electrode are formed above the active layer, and located at a first end and a second end of the active layer which are opposite to each other, respectively, the drain electrode completely covers the second end of the active layer.

As the drain electrode may completely cover the second end of the active layer, then a portion of the drain electrode for covering the second end of the active layer is of a width in a longitudinal direction greater than or equal to that of the second end of the active layer. The longitudinal direction is vertical to a connecting line between the first end and the second end of the active layer.

According to embodiments of the present disclosure, the drain electrode completely covers one end of the active layer, so as to protect the active layer as much as possible, thereby to avoid the active layer from being adversely affected by subsequent manufacturing process, environment where the active layer is located after being manufactured, or the like.

The above are merely the preferred embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. A thin film transistor, comprising a gate electrode, a gate insulating layer, an active layer, a source electrode and a drain electrode, wherein the source electrode and the drain electrode are formed above the active layer, and located at a first end and a second end of the active layer which are opposite to each other, respectively; and the drain electrode completely covers the second end of the active layer, wherein the drain electrode comprises a covering electrode and a contacting electrode connected to each other, the covering electrode completely covers the second end of the active layer and is of a width in a longitudinal direction greater than or equal to that of the active layer, the contacting electrode is configured to contact a pixel electrode and is of a width in the longitudinal direction greater than that of the covering electrode, the longitudinal direction is perpendicular to a connecting line between the first end and the second end of the active layer.

2. The thin film transistor according to claim 1, wherein the drain electrode is of a rectangular shape.

3. The thin film transistor according to claim 1, wherein the drain electrode further comprises a connecting electrode located between the covering electrode and the contacting electrode and connected to the covering electrode and the contacting electrode respectively, wherein the connecting electrode at least partially overlaps the gate electrode and is of a width in the longitudinal direction smaller than that of the covering electrode.

4. The thin film transistor according to claim 3, wherein the covering electrode and the connecting electrode are connected in a T form or an L form.

5. The thin film transistor according to claim 1, wherein the covering electrode is of a rectangular shape.

6. The thin film transistor according to claim 1, wherein the covering electrode is of a shape of a Chinese character "凹" with an opening towards the source electrode.

7. The thin film transistor according to claim 3, wherein the contacting electrode is of a width in the longitudinal direction greater than or equal to that of the connecting electrode.

8. The thin film transistor according to claim 1, wherein the source electrode completely covers the first end of the active layer.

9. The thin film transistor according to claim 1, wherein the source electrode comprises a first electrode, a second electrode and a third electrode; the second electrode is located between the first electrode and the third electrode, and connected to the first electrode and the third electrode respectively;

the first electrode completely covers the first end of the active layer;

the second electrode at least partially overlaps the gate electrode and is of a width in the longitudinal direction smaller than that of the first electrode and the second electrode respectively.

10. The thin film transistor according to claim 9, wherein the first electrode and the second electrode are connected in a T form or an L form.

11. The thin film transistor according to claim 9, wherein the first electrode is of a rectangular shape.

12. The thin film transistor according to claim 9, wherein the first electrode is of a shape of a Chinese character "凹" with an opening towards the drain electrode.

13. An array substrate, comprising the thin film transistor according to claim 1.

14. A display device, comprising the array substrate according to claim 13.

15. A method for manufacturing a thin film transistor, comprising a step of forming a gate electrode, a gate insulating layer, an active layer, a source electrode and a drain electrode, wherein the source electrode and the drain electrode are formed above the active layer, and located at a first end and a second end of the active layer which are opposite to each other, respectively, the drain electrode completely covers the second end of the active layer, wherein the drain electrode comprises a covering electrode and a contacting electrode connected to each other, the covering electrode completely covers the second end of the active layer, and is of a width in a longitudinal direction greater than or equal to that of the active layer; the contacting electrode is configured to contact a pixel electrode; and is of a width in the longitudinal direction greater than that of the covering direction is perpendicular to a connecting line between the first end and the second end of the active layer.

* * * * *